United States Patent [19]

Gupta

[11] 4,286,219
[45] Aug. 25, 1981

[54] HIGH RESOLUTION FREQUENCY SYNTHESIZER

[75] Inventor: Shanti S. Gupta, Gaithersburg, Md.

[73] Assignee: Communications Satellite Corporation, Washington, D.C.

[21] Appl. No.: 79,603

[22] Filed: Sep. 27, 1979

[51] Int. Cl.³ .................... H03L 7/00; H03B 19/00
[52] U.S. Cl. ...................................... 328/14; 307/271
[58] Field of Search ........................... 328/14; 307/271

[56] References Cited

U.S. PATENT DOCUMENTS

| B 538,686 | 1/1976 | Green | 328/14 |
|---|---|---|---|
| 3,293,561 | 12/1966 | Hegarty | 328/14 |
| 4,105,949 | 8/1978 | Hardin | 328/14 |
| 4,185,247 | 1/1980 | Harrison | 328/14 |

OTHER PUBLICATIONS

A Microprocessor Controlled Freq. Synthesized Signal by Jenkins et al., Conference Proc. on Programmable Inst. Teddington, England, pp. 22–24, Nov. 1977.

Primary Examiner—Harold A. Dixon
Attorney, Agent, or Firm—Sughrue, Rothwell, Mion, Zinn and Macpeak

[57] ABSTRACT

A programmable frequency source is used to synthesize a wide range of frequencies in small increments. A master oscillator and a single programmable divider are used. Each selected frequency possesses a phase jitter, predictable and a function of the master oscillator-to-output frequency relationship. The output of the frequency source is a square wave whose transitions are edge synchronous with the master oscillator.

8 Claims, 4 Drawing Figures

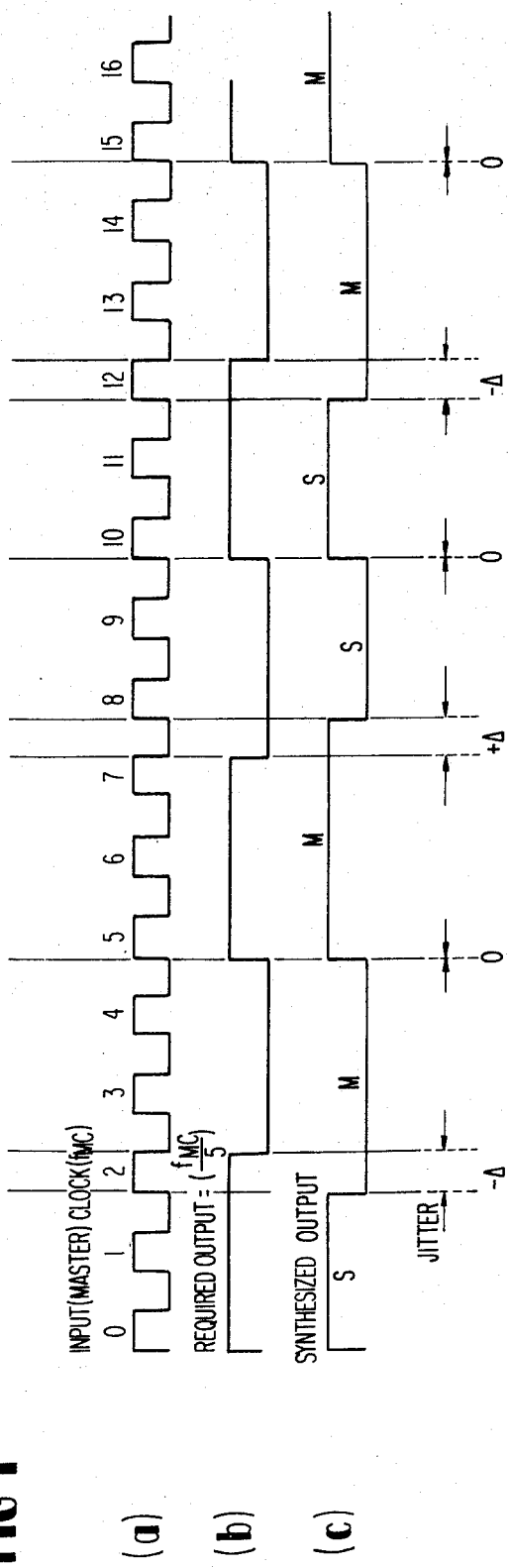
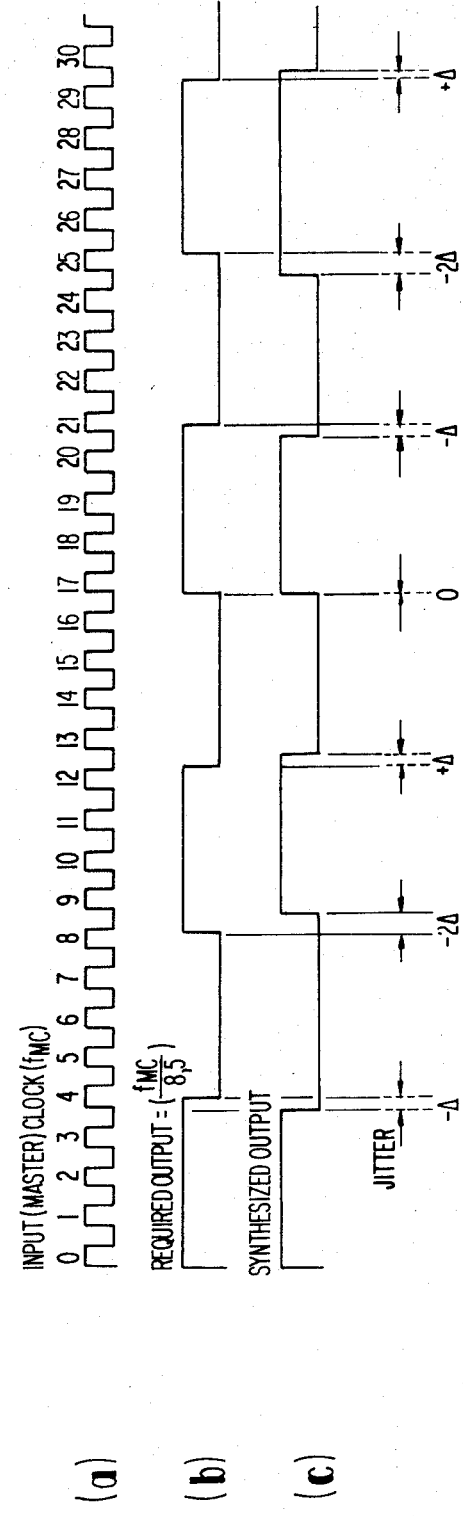

4,286,219

HIGH RESOLUTION FREQUENCY SYNTHESIZER

BACKGROUND OF THE INVENTION

This invention relates to a controlled frequency synthesizer used for a time synchronization in a satellite communication. In such systems, one technique of data transmission is timed division multiple access (TDMA). Although systems are well-known and one of the techniques of alignment of the transmit oscillator clock in a transmitting station to a reference station is to transmit at a certain number removed from the unique word of the reference station. This is achieved by checking at the receive side of the station. If then, the station unique word distance either increases or decreases as a result of clock stability or Doppler effect, the transmit time will be changed.

Such a technique enables the station time slot to be in the same TDMA frame. The transmit time will be altered one symbol at a time and the second change will be accomplished following round trip delay. This causes the terrestrial network data and clock to become Asynchronous to the time division multiple access frame. As a result data may be lost or sent to the wrong direction. To correct this problem the terrestrial interface module terrestrial clock (TIM) from the TDMA must be changed in such a way that they will remain synchronous to the TDMA clock and will not exhibit any abrupt changes.

SUMMARY OF THE INVENTION

It is an object of this invention to provide for a simple programmable frequency source which is able to synthesize a wide range of frequencies in small increments to reduce the number of our clock sources in a TDMA network.

A further object of this invention is to produce a high resolution synthesizer wherein the TDMA TIM clock frequency will be independent of the TDMA clocks.

A further object of this invention is to produce a high resolution synthesizer that prevents loss of data and utilizes one symbol shifting for changing the TIM clock.

Accordingly, a principal application for this invention is in digital equipment which requires multiple, unrelated clock sources. A characteristic example is a TDMA terminal. In such systems, a number of crystal oscillators would have to be provided and as a result all of the clock sources would suffer from mutual instability which could result in timing losses. By use of the present invention, these oscillators are all replaced with a single master oscillator and a programmable divider chain for the required frequency. As a result, all of the desired frequencies can be provided with a reduction in the overall system cost. Moreover, the problem of mutual instability is eliminated since all of the frequencies are derived from a common source.

The present invention represents a new approach by using a single master oscillator and a programmable divider rather than have a single loop dedicated to one frequency. Typical PLL technology cannot demonstrate satisfactory performance where the frequency variation is large due to unacceptably high jitter rates, however, with the present invention frequency control is maintained. The present invention finds application in systems generally using a large number of phase lock loops since it is a replacement for them. Typical applications are tone generators such as electronic organs where frequency division controlled by PLL circuitry is conventionally used. Another application is in digital video clock systems. In such cases, overall system cost is reduced by the replacement of a number of PLL circuits with a single circuit of this invention.

In the present invention, in the context of TDMA, the TIM terrestrial clock is monitored in terms of one symbol shift and the clock is changed. The clock then remains operational until the time difference between the new clock and the reference produces an equivalence of one symbol time. Accordingly, one symbol time is distributed over a time period such that the change will not appear in the data transmission as a jitter or result in a loss of that data. Accordingly, the TDMA and TIM frequencies remain synchronized since the TIM clocks revert back to the previously established standard clock.

This invention will be described in greater detail with respect to the description of the preferred embodiments and the accompanying drawings.

BRIEF DESCRIPTION OF THE DRAWINGS

FIG. 1 is a waveform drawing showing master clock wave forms together with the waveform of the generated output;

FIG. 2 is a second waveform diagram showing master clock output and the waveform of the output to be generated for a second case;

DESCRIPTION OF THE PREFERRED EMBODIMENT

Figure 3:
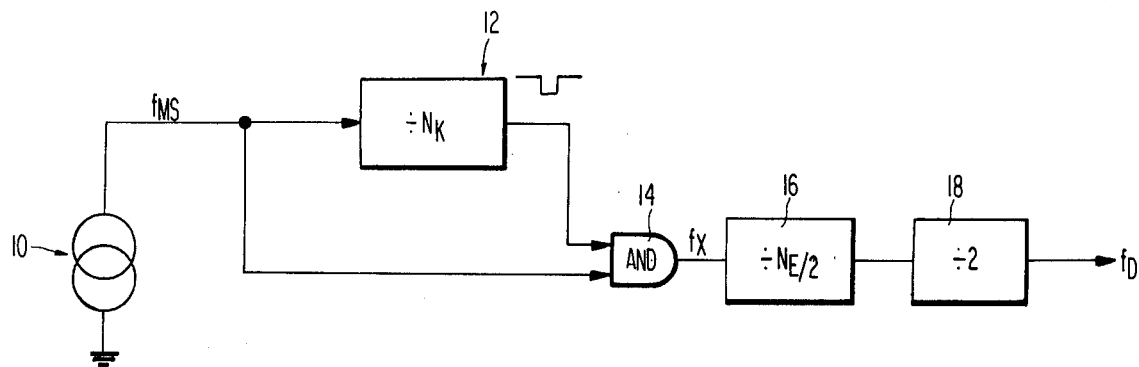
FIG. 3 is a block diagram showing a generalized high resolution frequency synthesizer in accordance with this invention.

Referring now to FIG. 1, a waveform diagram is shown having three plotted outputs. The first plot, waveform (A) is the input master clock wave train ($f_{mc}$). Waveform (B) is the required output in this case specified to have a period of times that of the master clock, that is, $f_{mc}/5$. It is well recognized that such an output is exceptionally difficult to achieve utilizing conventional binary dividers. The synthesized output is shown as waveform (C) comprising a series of short and long marks and spaces.

As shown in FIG. 1, by using such a combination of short and long marks together with spaces the required average frequency can be achieved. However, there is a jitter penalty. That is, as shown the difference between the synthesized output and the required output yields a jitter component which is a function of the difference between the master clock and the required frequency.

Therefore, by choosing a suitable high master clock frequency, the jitter can be reduced to an acceptable limit. In the case of the FIG. 1 example, the duration of the short and long marks is determined by using two dividers.

In accordance with this invention, the two dividers can be made programmable, having cycle lengths of 2 and 3. The outputs can then be alternately fed to a binary divider whose output would control whether the output of the 2 of 3 length counter would be selected. Accordingly, as shown in FIG. 1, the output would consist of a mark having three master clock cycles, followed by a space of 3, followed by a mark of 2 and subsequently a space of 2. As shown, the cycle will then repeat itself.

Referring now to FIG. 2, a second and more difficult case is shown. In this example, the output waveform is defined as having a period 8.5 times that of the input master clock waveform. Using conventional binary dividers, this output would be inpossible to achieve. As shown, the synthesized output comprises four short marks and spaces followed by one long mark. The pattern is then repeated except that the marks and spaces are reversed. The complete cycle then, as shown in FIG. 2, would comprise in the following order, short mark, short space, short mark, short space, long mark, short space, short mark, short space, short mark, long space, and so on. The pattern will then be repeated over five output cycles. Also, it should be noted that the jitter is plus or minus one master clock pulse.

The required output can be generated in a manner compatible with that defined for the example shown in FIG. 1. A divide by four counter will cycle the output of a binary divider until a second divide by four counter will change over a switch to allow the divide by five counters to cycle the output dividers. Accordingly, the output divider will be fed with four pulses of a length four clock cycles and then one pulse of a length five clock cycles.

Given these two examples, this invention proceeds from a recognition that a generalized, practical implementation can be attained. Accordingly, the analysis that follows is definitive of a generalized implementation of a high resolution frequency synthsizer in accordance with this invention.

Assume that the acceptable jitter in the TDMA TIM clock frequency is A nanosecond. The lowest master clock frequency is:

$$f_{MS} = 1/A \text{ MHz} \tag{1}$$

Let the desired TDMA TIM frequency be $f_D$.

$$\text{Ratio of two frequencies } N = f_{MS}/f_D \tag{2}$$

Let $$N = N_E + N_R \tag{3}$$

where,
$N_E$ = Even number, preferably highest, but cannot be more than N, and
$N_R$ = Remainder; can be whole or fraction, but cannot be negative.

From equations (2) and (3), $$f_{MS}/f_D = N + N_R \tag{4}$$

or $$f_{MS} = N_E f_R f_D \tag{5}$$

let $$N_E f_D = f_x \tag{6}$$

or $$N_R f_D = f_{MS} - f_x$$

where,
$f_x$ = frequency or number of bits per second which is an even multiple of desired frequency, and $N_R f_D$ = Difference of bits per second between master and $f_x$.

Divide equation (5) by $N_R f_D$ $$(f_{MS})/(N_R f_D) = (N_E f_D)/(N_R f_D) + 1 \tag{7}$$
$$= [(N_E + N_R)f_D]/N_R f_D = N/N_R = N_K$$

or $$N_R f_D = f_{MS}/N_K \tag{8}$$

Let
$N_{KH1}$ = first higher whole number to $N_K$,
$N_{KL1}$ = first lower whole number to $N_K$,
$N_{KH2} = (N_{KH1} + 1)$,
$N_{KL2} = (N_{KL1} - 1)$
and so on.
$Q_{H1}$ = multiplier of $N_{KH1}$
$Q_{H2}$ = multiplier of $N_{KH2}$
$Q_{L1}$ = multiplier of $N_{KL1}$
$Q_{L2}$ = multiplier of $N_{KL2}$
and so on.
Let $$N_K = \frac{N_{KH1}Q_{H1} + N_{KL1}Q_{L1} + N_{KH2}Q_{H2} + N_{KL2}Q_{L2} + \cdots}{Q_{H1} + Q_{L1} + Q_{H2} + Q_{L2} \cdots}$$

or $$N_K = \frac{\sum_{p=1}^{r}(N_{KHp}Q_{HP} + N_{KLp}Q_{Lp})}{\sum_{p=1}^{r}(Q_{HP} + Q_{Lp})}$$

After obtaining $N_{KHp}$, $N_{KLp}$, $Q_{HP}$, and $Q_{Lp}$, these bits are distributed over a time frame such that one bit appears every $N_{KHp}$ bits later $Q_{Hp}$ times; similarly, one bit appears every $N_{KLp}$ bit later $Q_{Lp}$ times. These two can be mixed.

Now, these distributed bits are used for stripping the bits from the master oscillator output. This can be achieved by either an AND gate or using a counter that is stopped for one bit when the $N_k$ pulses appear. The new bit rate so obtained is $f_x$. Using the counter, divide this new $f_x$ by $N_E/2$. Then divide by 2 to get a symmetrical waveform which is desired frequency $f_D$. The jitter is generated due to missing bits in $f_x$. The jitter may be disregarded at lower frequencies.

Referring now to FIG. 3, a block diagram of the frequency synthesizer in accordance with this invention is shown. A reference input from a master clock 10 generates the input clock pulses $f_{mc}$. That clock output is fed to a divider 12 to perform the necessary $N_K$ division. That output, in the form of a distributed bit is fed to the AND gate 14. As indicated, the distributed bits are used for stripping the bits from the master oscillator output utilizing the AND gate 14. The resulting output $f_x$ is fed to the second divider 16 where the division function $N_{E/2}$ is performed. To obtain a symmetrical waveform, the desired frequency $F_D$, a final division is performed in a third divider section 18.

Given this block diagram, a numerical example will now be provided showing operation of the frequency synthesizer.

| Numerical Example - FIG. 3 | |
|---|---|
| TDMA clock frequency | 60.032 MHz |

-continued

Numerical Example - FIG. 3

| | |
|---|---|
| Desired TDMA TIM frequency | 1.544 MHz |
| Acceptable jitter at TDMA TIM frequency | 5 ns max. |
| Master oscillator frequency required | $1/5$ ns = 200 MHz |
| Master oscillator frequency 4 times that of TDMA clock frequency | 240.128 MHz |
| TDMA clock frequency = 240.128/4 | 60.032 MHz |
| TDMA TIM frequency $f_D$ | 1.544 MHz |
| Ratio of $f_{ms}$ and $f_D$ frequencies $N = 240.128/1.544$ | 155.5233161 |
| Nearest even number $N_E = 154$; $N_R = (N - N_E)$ $N_R = (155.5233161 - 154) = 1.5233161$ | |
| since $N_K = N/N_R$ = 155.5233..../1.5233.... = 102.0952381 | |
| so $N_K = (102 \times 19 + 103 \times 2)/21 = 102.0952381$ | |

As indicated in this Numerical Example, the divider 12 for $N_K$ will divide 102 ten times, 103 one time, 102 nine times and then 103 one time. This output would be fed to the AND gate 14 and subsequently to the second divider section for performing the division $N_E/2$. Since $N_E$ is 154, the divisor would be 77.

As shown in the Numerical Example, the jitter would be approximately 4 nsec and the stability of 1.544 MHz is obtained having approxiately the same stability as the TDMA clock. It should be noted that this technique can also be used for obtaining additional terrestrial network bit rates in the context of TDMA such as 2.048 Mb/s, 6.312 Mb/s, 6.336 Mb/s, 3.5795 MH/s and 8.488 Mb/s, etc.

Figure 4:
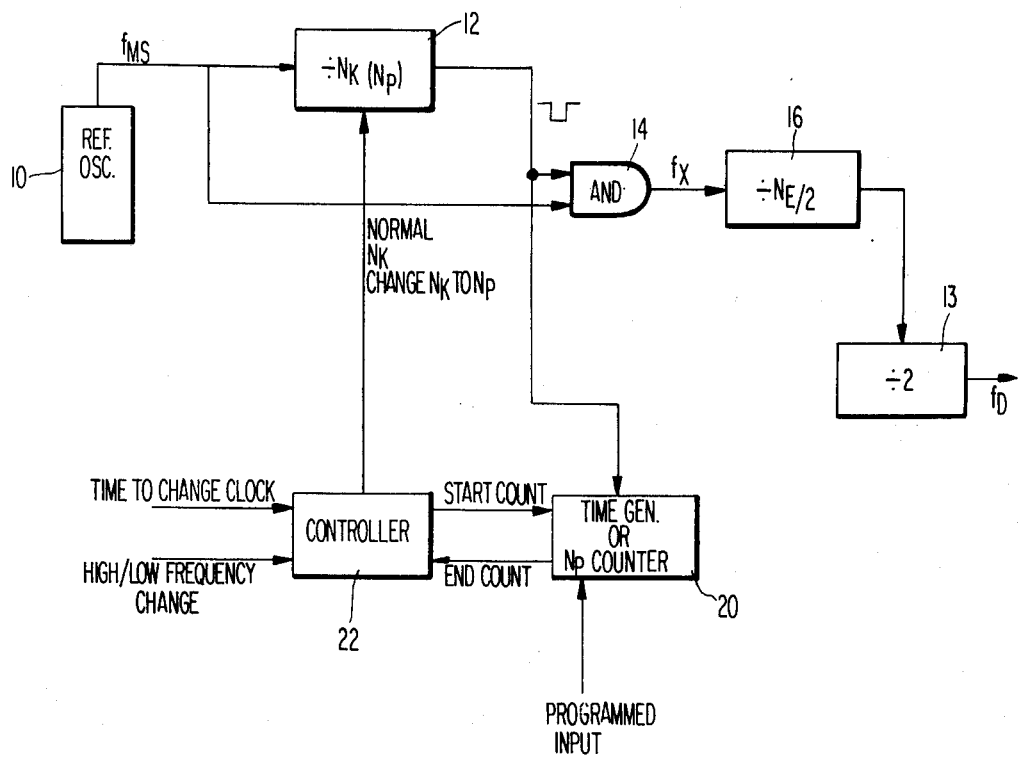
FIG. 4 is a block diagram showing a second embodiment of a high resolution control frequency synthesizer in accordance with this invention.

Referring now to FIG. 4, a second embodiment of this invention is presented. This embodiment is premised on the recognition as defined with respect to FIG. 3 that when two frequencies are counted relative to a fixed number, they produce a different time base. If one frequency is changed temporarily to another for a time duration, then the number of bits will change during that period.

It first may be assumed that there are N bits in a time-based frame and it is synchronous. If abruptly the time base frame is changed for only one time, the frequency which is producing N bits will either have a jitter component to remain synchronous or it will become asynchronous. However, if the frequency is modified for a period such that it will compensate for the difference of one time change in the time base frame, the frequency will again become synchronous to the frame without having a jitter component. Accordingly, the technique utilized is a change of $N_K$ which will change the TIM clock.

The time base generated by $N_K$ is $$N_k/f_{ms},$$

where $N_k$ is the $N_k$th pulse which has a width of $1/f_{ms}$. When $N_k$th pulse is stopped from $f_{ms}$, time loss in $N_k/f_{ms}$ is $1/f_{ms}$ sec.
time loss in 1 sec. is $1/N_k$ sec.

When $N_k$ is changed to $N_p$ with new time loss in 1 sec. $= 1/N_p$.
If clocks are changed Difference between the two systems time
loss $= 1/N_k - 1/N_p = (N_p - N_k)/(N_k N_p)$ So,
$(N_p - N_k)/(N_p N_k)$ sec, of difference time generated in 1 sec.

1 second of difference time generated in $(N_k N_p)/(N_p - N_k)$ sec.
Therefore,
in R nano sec. difference time generated $= R \cdot N \cdot N_k/(N_p - N_k)$ n. sec.
Hence,
to correct 1 symbol jump of R nano sec. $R \cdot N_p \cdot N_k/N_p - N_k$ n. sec. are required.
This time is generated by $N_p$.
The $N_p$ repeats at a rate of $N_p/f_{ms}$ seconds.
So, if $N_p/f_{ms}$ seconds 1 pulses appear, and in 1 second $f_{ms}/N_p$ pulses appear.
Therefore, in
$R \cdot N_p \cdot N_k/(N_p - N_k)$ nano sec. $(f_{ms} R \cdot N_p \cdot N_k)/[N_p (N_p - N_k) 9 \times 10^9]$ pulses appear.
Let $f_{ms}$ is in MHz.
In $R \cdot N_p \cdot N_k/(N_p - N_k)$ nano sec.
$f_{ms} R \cdot N_k/(N_p - N_k) \times 10^{-3}$ pulses appear.
Therefore,
if $N_k$ is changed to $N_p$ for $f_{ms} R \cdot N_k/(N_p - N_k) \times 10^{-3}$ pulse duration the system will become synchronous.

As shown in FIG. 4, a controller 22 is used receiving three inputs, the first being for the desired time at which the clock is to be changed; the second, a high-low frequency change signal; and the third being an end count control signal.

The first input signal indicates to the controller that a change from $N_k$ to $N_p$ is indicated while the second input directs the sense of the changes, that is to a higher or lower frequency. At the same time the counter 20 receives an initiation signal to begin counting $N_p$ pulses up to a predetermined number. At the end of the count, the END count control signal is issued to tell the counter 12 to revert to $N_k$. Hence, the time generator functions to determine the time increment necessary to regain or lose the pulse difference between $N_p$ and $N_k$. It may be either a fixed counter for a single frequency or programmed for variable frequencies. Accordingly, the controller 22 is employed to make either temporary or incremented changes to the divider 12.

The controller 22 may comprise two flip-flop elements such as Mc10131 having their respective 0 inputs receiving the high/low signal. The Q and $\overline{Q}$ inputs would be coupled to the counter 12 and the reset inputs SD coupled to the time base generator 20. The clock inputs would receive the time to change clock signal. The remaining counters and dividers can be, for example, at 240 MHz standard ECL (emitter coupled logic) circuits. Also, although not shown, some pulse shaping circuitry may be included to maintain square wave outputs.

To better explain the functioning of the FIG. 4 embodiment, a numerical example will not be presented.

Numerical Example—FIG. 4

$f_{ms} = 240.128$ MHz
Let $N_k = 102.0952381$ to generate 1.544 MHz,
Let R = 30 nano seconds,
Let $N_p = 102.15348462$ to generate 1.544008762 MHz.
Formula $= (R \times N_p N_k)/(N_p - N_k)$ nano seconds
So,
30 nano seconds time delay is generated in
$= (30 \cdot 102.1538462 \times 102.0952381/(102.1538462 - 10 - (2.0952381)$ nano sec.
$= 5338.479058 \ \mu$ sec.
Number of $N_p$ pulses required to generate this time is
$(f_{ms} R N_k \cdot 10^{-3})/(N_p - N_k)$ $$= (240.128 \cdot 30 \cdot 102.09523\text{-} \\ 81 \cdot 10^{-3})/(102.1538462 - 102.0952381)$$
$$= 12548.9 \text{ pulses}$$

1.544 MHz clock is changed to 1.544008.762 MHz clock for 5338.479058 $\mu$ sec to correct a 30 n.sec. jump.

Accordingly the reference oscillator 10 will produce a frequency of 240.128 MHz. The $N_p$ counter 20 will count 12,549 pulses. The system therefore provides a powerful technique of maintaining the TDMA and TIM frequencies synchronized. Also, as shown, the system will work over an extremely wide range of master clock instability and doppler effect conditions.

It is apparent that other modifications and variations of this invention are possible without departing from the essential scope thereof.

What is claimed is:

1. A high resolution frequency synthesizer for producing a pulse train of frequency $f_D$ comprising: an oscillator producing an output pulse train having a clock frequency of $f_{ms}$, a programmable divider receiving an input signal that is a function of $f_{ms}$ and performing a division thereon in accordance with:

$$[(N_E + N_R)f_D]/N_R f_D$$

where, $N_E$ is an even number higher but not exceeding $f_{ms}/f_D$, and $N_R$ is the remainder of $f_{ms}/f_D - N_E$, either a whole number or fraction but not a negative quantity to obtain an output $f_x$, that is the frequency or number of bits per second which is an even multiple of $f_D$ and means for obtaining a symmetrical waveform from $f_x$ which is $f_D$.

2. The synthesizer of claim 1 further comprising an AND gate receiving respective outputs from said oscillator and said programmable divider and producing a bit rate of $f_x$.

3. The synthesizer of claim 2 further comprising a second divider for dividing said AND gate output by $N_E/2$.

4. The synthesizer of claims 1, 2 or 3 wherein said means to obtain a symmetrical waveform comprises a divide by 2 divider, dividing $f_x$.

5. The synthesizer of claims 1, 2 or 3 further comprising controller means to convert $N_k$ to $N_p$ when the time loss in one second equals $1/N_p$, said controller means providing said programmable divider with an input signal $N_p$ to convert $N_k$.

6. The synthesizer of claim 5 further comprising counter means to establish a count indicative of $N_p$.

7. The synthesizer of claim 6 wherein said counter means comprises a counter counting to a predetermined value of $N_p$.

8. The synthesizer of claim 6 wherein said counter means comprises a programmable counter counting to a variable, programmed value of $N_p$.

* * * * *

UNITED STATES PATENT AND TRADEMARK OFFICE
CERTIFICATE OF CORRECTION

PATENT NO. : 4,286,219

DATED : August 25, 1981

INVENTOR(S) : Shanti S. Gupta

It is certified that error appears in the above—identified patent and that said Letters Patent is hereby corrected as shown below:

Col. 1, line 26, "direction" to --location--.

Col. 3, line 8, "inpossible" to --impossible--.

Col. 3, line 55, equation (4) to $--f_{ms}/f_D = N_E + N_R --$

Col. 3, line 59, equation (5) to $--f_{MS} = N_E f_D + N_R f_D --$

Col. 6, line 15, " $-N_K)$ " to -- $-N_K)]$ --

Col. 6, line 54, "not" to --now--.

Signed and Sealed this

First Day of December 1981

[SEAL]

Attest:

Attesting Officer

GERALD J. MOSSINGHOFF

Commissioner of Patents and Trademarks